United States Patent [19]

Harper et al.

[11] Patent Number: 5,243,222

[45] Date of Patent: Sep. 7, 1993

[54] COPPER ALLOY METALLURGIES FOR VLSI INTERCONNECTION STRUCTURES

[75] Inventors: James M. E. Harper, Yorktown Heights; Karen L. Holloway, Mount Kisco, both of N.Y.; Thomas Y. Kwok, Westwood, N.J.

[73] Assignee: International Business Machines Corporation, Armonk, N.Y.

[21] Appl. No.: 818,169

[22] Filed: Jan. 8, 1992

Related U.S. Application Data

[62] Division of Ser. No. 681,798, Apr. 5, 1991, Pat. No. 5,130,274.

[51] Int. Cl.$^5$ .................... H01L 23/48; H01L 29/54
[52] U.S. Cl. .................... 257/774; 257/741; 257/762
[58] Field of Search .............. 257/774, 741, 781, 736, 257/748, 760, 762, 768

[56] References Cited

U.S. PATENT DOCUMENTS

| | | |
|---|---|---|
| 3,631,304 | 12/1971 | Bhatt . |
| 4,566,177 | 1/1986 | van de Ven et al. . |
| 4,720,908 | 1/1988 | Wills .................... 257/774 |
| 4,784,973 | 11/1988 | Stevens et al. .................... 437/190 |
| 4,805,009 | 2/1989 | Pryor et al. . |
| 4,816,425 | 3/1989 | McPherson .................... 437/195 |
| 4,827,326 | 5/1989 | Altman et al. . |
| 4,843,453 | 6/1989 | Hooper et al. .................... 257/762 |
| 4,866,008 | 9/1989 | Brighton et al. .................... 257/762 |
| 4,884,123 | 11/1989 | Dixit et al. .................... 257/774 |
| 4,910,169 | 3/1990 | Hoshino .................... 257/741 |
| 4,916,509 | 4/1990 | Blanchard et al. .................... 257/741 |
| 4,985,750 | 1/1991 | Hoshino .................... 257/762 |
| 4,996,584 | 2/1991 | Young et al. .................... 257/762 |

FOREIGN PATENT DOCUMENTS

| | | |
|---|---|---|
| 0061593 | 10/1982 | European Pat. Off. . |
| 0261846 | 3/1988 | European Pat. Off. . |
| 0335383 | 10/1989 | European Pat. Off. . |
| 0421735 | 4/1991 | European Pat. Off. . |
| 55-107257 | 8/1980 | Japan .................... 357/67 |
| 59-43570 | 10/1984 | Japan . |
| 60-7162 | 1/1985 | Japan .................... 357/67 |
| 62-113421 | 5/1987 | Japan .................... 437/190 |
| 2-50432 | 2/1990 | Japan .................... 357/67 |

OTHER PUBLICATIONS

Chang, C. A., "Ta as a Barrier for the Cu/PtSi, Cu/Si and Al/PtSi Structures," *J. of Vacuum Science & Technology A*, vol. 8, No. 5, pp. 3796–3802 (1990).

Towner, J. M., et al., "Effects of Vanadium and Chromium on Aluminum Electromigration", *J. Appl. Phys.*, 61(4):1392 (1987).

d'Heurle, F. M., et al., "Improving the Lifetime of Aluminum Films", *IBM Technical Disclosure Bulletin*, 13(12):3793 (1971).

Ames, I., et al., "Copper-Doped Aluminum Stripes", *IBM Technical Disclosure Bulletin*, 13(7):1748 (1970).

*Primary Examiner*—Eugene R. LaRoche
*Assistant Examiner*—Son Dinh
*Attorney, Agent, or Firm*—Scully, Scott, Murphy & Presser

[57] ABSTRACT

A method for providing vias, lines and other recesses in VLSI interconnection structures with copper alloys to create a thin layer of an oxide of an alloying element on the surface of the deposited alloy and on portions of the alloy which are in contact with an oxygen containing dielectric is disclosed. The present invention is also directed to VLSI interconnection structures which utilize this copper alloy and thin oxide layer in their vias, lines and other recesses. The oxide layer eliminates the need for diffusion barrier and/or adhesion layers and provides corrosion resistance for the deposited copper alloy. VLSI devices utilizing this copper alloy in the vias, lines and other recesses interconnecting semiconductor regions, devices and conductive layers on the VLSI device are significantly improved.

7 Claims, 1 Drawing Sheet

COPPER ALLOY METALLURGIES FOR VLSI INTERCONNECTION STRUCTURES

This is a divisional of copending application Ser. No. 681,798, filed on Apr. 5, 1991 now U.S. Pat. No. 5,130,274.

BACKGROUND OF THE INVENTION

1. Field of the Invention

The present invention relates generally to very-large-scale-integrated (VLSI) metal interconnection structures, electrical conductors, thin-film conductive stripes and fabrication methods therefor, and more particularly, to providing improved copper alloy conductors for such structures.

2. Description of the Prior Art

In the past, VLSI fabrication steps utilized aluminum as the single metallurgy for contacts and interconnects in semiconductor regions or devices located on a single substrate. Aluminum was desirable because of its low cost, good ohmic contact and high conductivity. However, pure aluminum thin-film conductive stripes had undesirable qualities, such as, a low melting point which limited its use to low temperature processing, diffusion into the silicon during annealing which leads to contact and junction failure, and electromigration. Consequently, a number of aluminum alloys were developed which provided advantages over pure aluminum For example, in U.S. Pat. No. 4,566,177, a conductive layer of an alloy of aluminum containing up to 3% by weight in total of silicon, copper, nickel, chromium and/or manganese was developed to improve electromigration resistance. In U.S. Pat. No. 3,631,304 aluminum was alloyed with aluminum oxide to improve electromigration resistance.

Emerging VLSI technology has placed stringent demands on Back-End-of-the-Line (BEOL) wiring requirements arising from high circuit densities and faster operating speeds required of future VLSI devices. This will require higher current densities in increasingly smaller conduction lines. Thus, higher conductance wiring is required which would require either larger wiring cross-sections for aluminum alloy conductors or a higher conductance wiring material. The trend in the industry has been to develop the latter using pure copper because its conductivity is higher than the conductivity of aluminum.

In the formation of VLSI interconnection structures, copper is deposited into a line, via or other recess to interconnect semiconductor regions or devices located on the same substrate. Copper is known as a cause of problems at semiconductor device junctions and hence, any diffusion of copper into the silicon substrate can cause device failure. In addition, pure copper does not adhere well to oxygen containing dielectrics such as silicon dioxide and polyimide. Thus, current practice for BEOL copper metallization includes 1000 Angstroms or thicker of a diffusion barrier and/or adhesion layer. For example, FIG. 1 is a schematic drawing of a portion of a VLSI interconnection structure 10. In structure 10, copper plug 12 is used to interconnect conductive layers and semiconductor devices located in a VLSI device Recess 14 is defined in dielectric layer 16 disposed on the surface of the copper conduction line 18. Physical vapor deposition or chemical vapor deposition methods are used to fill interconnection structure 10 with adhesion layer 20 and copper plug 12. Since copper does not adhere well to oxygen containing dielectrics nor to itself, layer 20 is used as an adhesive to allow the copper plug 12 to adhere to dielectric layer 16 and copper conduction line 18. The adhesion layer 20 is composed of a refractory metal composite such as titanium-tungsten (TiW) or titanium-nitride (TiN).

FIG. 2 is a schematic diagram of a portion of another VLSI interconnection structure 22. The copper plug 12 in interconnection structure 22 is used to contact semiconductor region 24 formed in silicon substrate 26. Illustratively, region 24 is a metal silicide contact composed of tantalum silicide ($TaSi_2$) or cobalt silicide ($CoSi_2$). Since copper reacts easily with silicides at low temperatures thereby diffusing into silicon substrate 26, diffusion and adhesion layer 20 is used to prevent such diffusion and to allow copper plug 12 to adhere to dielectric layer 16.

There are several problems with using a diffusion barrier and/or adhesion layer, such as layer 20, for BEOL copper metallization. In structure 10, by encasing a portion of the recess 14, the adhesion layer 20 interposes a layer between the copper conductor 12 and the copper conduction line 18. This gives rise to contact resistances and the added series resistance of the adhesion layer 20. In structures 10 and 22, although the diffusion barrier and/or adhesion layer 20 is conductive, it is more resistive than pure copper and its presence decreases the available copper cross-sectional area of recess 14, thereby diminishing the current-carrying capacity of micron or smaller lines. Thus, in order to meet the current demands on BEOL wiring requirements, there is a need to develop copper metallization which does not have the above problems.

SUMMARY OF THE INVENTION

The present invention is directed to a method for providing vias, lines and other recesses in VLSI interconnection structures with a copper alloy to form a thin layer of an oxide of an alloying element on the surface of the deposited alloy and on surfaces of the alloy which are in contact with oxygen containing dielectrics. The invention is also directed to novel VLSI interconnection structures formed by use of the inventive method.

The first step in the method of the present invention is to provide a copper alloy containing an alloying element of less than 2.0 atomic percent. In one embodiment of the present invention, the second and final step is to deposit the copper alloy into the via, line or recess at a deposition temperature which will form the thin oxide layer. The copper alloy could be deposited by any physical vapor deposition (PVD) or any chemical vapor deposition (CVD) method. In another embodiment of the present invention, the second step is to deposit the copper alloy into the via, line or recess at a deposition temperature that will not form the thin oxide layer. Next, the interconnection structure is annealed to form the thin oxide layer.

The oxide layer performs several functions. First, the oxide layer acts as an adhesive to allow the copper alloy to adhere to the oxygen containing dielectrics. Second, the oxide layer acts as a diffusion barrier thereby containing the copper alloy within the line or recess. Third, the oxide layer acts as a passivating layer thereby providing corrosion resistance for the deposited copper alloy. Lastly, the oxide layer prevents hillock formation.

The present invention is a significant improvement over BEOL copper metallization utilizing prior art diffusion barrier and/or adhesion layers. One embodiment of the present method only requires one deposition step whereas the prior art requires two deposition steps. Secondly, the present invention increases the current-carrying capacity of micron or smaller lines by increasing the available cross-section of copper alloy in the via, line or recess. Lastly, the present invention eliminates the series resistance and contact resistances that are present in prior art adhesion layers used in an interconnection structure which interconnects semiconductor devices or conductive layers.

BRIEF DESCRIPTION OF THE DRAWINGS

In the drawings, the same reference numerals denote the same structural elements.

DETAILED DESCRIPTION OF THE INVENTION

Figure 3:
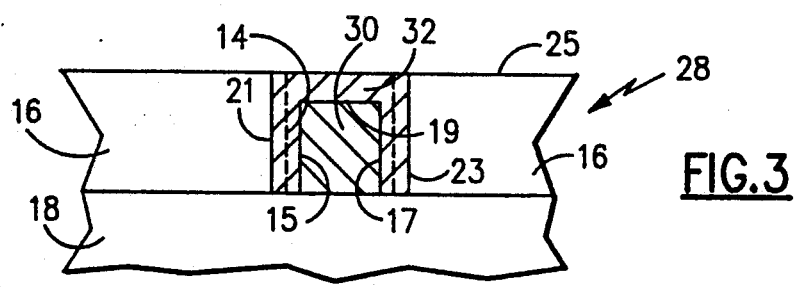
FIG. 3 is a schematic drawing showing the cross-section of a line or recess in a portion of a VLSI interconnection structure after the deposition of the copper alloy and formation of the thin oxide layer in accordance with the method of the present invention.

In accordance with the present invention, a novel interconnection structure is formed by depositing a copper alloy of copper and an alloying element into a via, line or other recess in an oxygen containing dielectric layer and forming a layer of an oxide of the alloying element on the copper alloy to act as a barrier/diffusion layer and as a self-passivating layer. Referring now to FIG. 3, there is shown a schematic diagram of a cross-section of a line or recess in a portion of a VLSI interconnection structure 28 having a copper alloy plug 30 and an oxide layer 32 of the alloying element. (For illustrative purposes only, the recess 14 will be referred to as a via but it is to be understood by those skilled in the art of filling interconnection structures in VLSI devices that the recess 14 may also be a line or other interconnection recess.)

An interconnection structure is a portion of a VLSI device in which a recess filled with a metal is used to interconnect semiconductor regions, devices or conductive layers located on the VLSI device. As shown in FIG. 3, the interconnection structure 28 includes a copper conduction line 18. A dielectric layer 16 is formed on conduction line 18 and includes the via 14 formed therein by well known photolithographic and etching techniques. The width of via 14 is typically on the order of one micron or smaller. The dielectric layer 16 is an oxygen containing material comprised of, for example, silicon dioxide or polyimide. The via 14 is the means by which a conductive connection will be made between contacts or lines formed above layer 16 and the copper conduction line 18.

The first step of the present invention is to provide a copper alloy which contains an alloying element held below 2.0 atomic percent. The alloy is prepared by standard metallurgical alloying techniques. The electromigration resistance of the alloyed copper is similar to that of pure copper. Suitable alloying elements which can be used to form copper alloys for the present method include aluminum and chromium.

Figure 4:
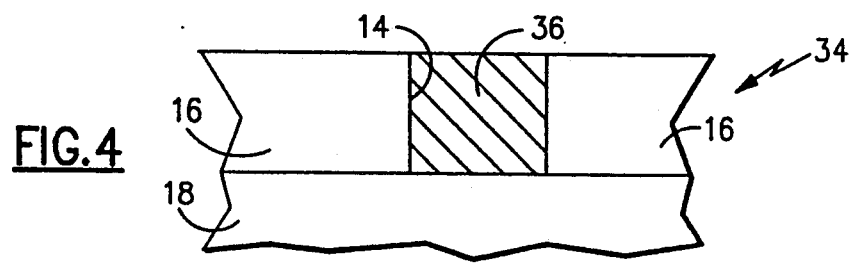
FIG. 4 is a schematic drawing showing the cross-section of a line or recess in a portion of a VLSI interconnection structure after the deposition of the copper alloy in accordance with the method of the present invention.
Figure 5:
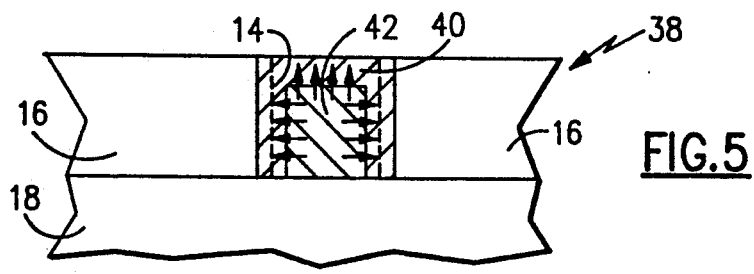
FIG. 5 is a schematic drawing showing the cross-section of a line or recess in a portion of a VLSI interconnection structure during the formation of the thin oxide layer in accordance with the method of the present invention.

Referring now to FIG. 4, in one embodiment of the present invention the second step is to deposit the copper alloy into recess 14 by any chemical vapor deposition (CVD) or physical vapor deposition (PVD) method such as evaporation or sputtering at a deposition temperature that is below 150° C. so that an oxide of the alloying element will not form at this stage. Next, as shown in FIG. 5, the structure 38 is annealed at a temperature between 250° and 400° C. for 30 minutes to an hour, depending on the temperature used, to form the thin layer 40 of an oxide of the alloying element only on the surfaces of the copper alloy plug 42 that are in contact with oxygen containing dielectric layer 16 and on exposed surfaces of the plug 42. When dielectric layer 16 is silicon dioxide, the thin layer 40 will be an oxide of the alloying element. When the dielectric layer 16 is polyimide, the thin layer 40 will be an oxide-carbide layer of the alloying element because some of the alloying element will react with the carbon as well as the oxygen in the polyimide. At temperatures between 250° C. and 400° C., some of the alloying element will segregate to surfaces of the copper alloy plug 42 that are in contact with oxygen, as shown by the arrows in FIG. 5, and react with the oxygen to form oxide layer 40. Since the alloying element is reacting with the oxygen in dielectric layer 16, a small portion of the oxide layer 40 will encroach into dielectric layer 16. The broken lines in FIG. 5 indicate the original boundary of dielectric layer 16 before the alloying element reacts with layer 16 to form the thin oxide layer 40. The thickness of oxide layer 40 is between 50 Å and 100 Å. Since the formation energy for the oxide of the alloying element is higher than the formation energy for copper oxide, an oxide of the alloying element forms first and prevents any copper from penetrating the layer 40. Thus, copper oxide will not be formed.

As shown in FIG. 3, the final result is interconnection structure 28 having a via, line or other recess 14 composed of copper alloy plug 30 and oxide layer 32. Due to the segregation of the alloying element the copper alloy plug 30 will contain about one-half the alloying element as originally contained in the copper alloy before segregation. For example, if the copper alloy contained 2.0 atomic percent of the alloying element, the copper alloy plug would only contain 1.0 atomic percent of the copper alloy. In addition, the oxide layer 32 is a progressive layer wherein the oxide concentration within layer 32 increases from surfaces 15, 17 and 19 towards surfaces 21, 23 and 25, respectively. The present invention is also directed to the interconnection structure 28.

It should be understood by those skilled in the art that further dielectric layers may be deposited on dielectric layer 16 and further interconnects will be made in these layers by opening recesses in the dielectric layers. If the dielectric layer deposited on layer 16 is polyimide, it will have to be cured at 35020 C. to 400° C. for 30 minutes to an hour. During this curing process the oxide layer 40 will form. Thus, the annealing step does not have to be a separate step but could be combined in the processes used to form subsequent interconnects.

It should also be understood by those skilled in the art of the present invention that the order of the above steps can be changed without departing from the spirit and scope of the present invention. For example, the copper alloy can be deposited by CVD or PVD as described above on copper conduction line 18 first. Next, the deposited alloy can be patterned by well known photolithographic and etching techniques. The last step would be to deposit the dielectric layer 16. If the dielectric layer 16 is polyimide, it must be cured as stated above. If the dielectric layer 16 is silicon dioxide, then it could be deposited by any CVD or PVD method.

In another embodiment of the present invention, the second and final step is to form in a single step, copper alloy plug 42 and thin oxide layer 40. The plug 42 and oxide layer 40 are formed by depositing the copper alloy of the invention into recess 14 at a deposition temperature which will create the thin layer 40 of an oxide of the alloying element. In this embodiment, the copper alloy can be deposited by any CVD or any PVD method provided that the deposition temperature is in the range of 150° C. to 250° C. In this embodiment, the formation of the oxide layer and the copper alloy plug will be the same as was described above and as shown in FIG. 5. As stated, some of the alloying element will segregate to surfaces of the copper alloy that are in contact with oxygen and react with the oxygen to form oxide layer 40. A small portion of the oxide layer 40 will encroach into dielectric layer 16 due to the reaction between the alloying element and the oxygen in dielectric layer 16. Copper oxide will not form because the formation energy for the oxide of the alloying element is higher than the formation energy for copper oxide.

When aluminum or chromium is used as the alloying element and the dielectric is silicon dioxide, the thin layer 32 would comprise aluminum oxide ($Al_2O_3$) or chromium oxide ($Cr_2O_3$), respectively. The oxide layer 32 performs several desirable functions. Pure copper does not adhere well to dielectrics. However, pure aluminum and pure chromium adhere to oxygen containing dielectrics much better than pure copper. In addition, aluminum oxide and chromium oxide have excellent adhesion with copper. Thus, oxide layer 32 acts as an adhesive to allow the copper alloy to adhere to oxygen containing dielectric layer 16. Secondly, the oxide layer 32 acts as a passivating layer thereby improving the corrosion resistance of the deposited copper alloy. Lastly, the oxide layer 32 provides improved resistance to physical distortions such as hillocks.

The present invention is a significant improvement over BEOL copper metallization utilizing prior art adhesion layers. First, the present method only utilizes one deposition step whereas the prior art requires two deposition steps-one to deposit the adhesion layer and a second step to deposit the copper plug. Second, since the oxide layer 32 forms partially inside dielectric layer 16 and is only 50–100 Å thick, it increases the available cross-section of copper alloy plug 30 thereby increasing the current-carrying capacity of micron or smaller lines. In addition, although the conductance of the copper alloy plug 30 will be less than that of pure copper, by holding the alloying element below 1.0 atomic percent, the degrading of the conductance due to the alloy will be offset by the increase in cross-sectional area of copper alloy plug 30. Since the oxide layer only forms on surfaces of the copper alloy that are in contact with oxygen, the copper alloy plug 30 will be directly in contact with the copper conduction line 18. Thus, the present metallization eliminates the series resistance and contact resistances that are present in prior art metallization using adhesion layers.

Figure 6:
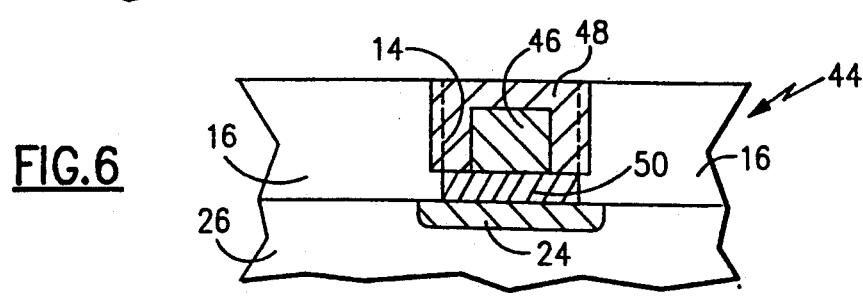
FIG. 6 is a schematic drawing showing the cross-section of a line or recess in a portion of another VLSI interconnection structure after the deposition of the copper alloy and formation of the thin oxide layer in accordance with the method of the present invention.

FIG. 6 is a schematic diagram of a cross-section of a line or recess in a portion of another VLSI interconnection structure 44 having a copper alloy plug 46 and an oxide layer 48 formed in accordance with the method of the present invention. The structure 44 includes a silicon substrate 26 having a metal silicide contact 24 formed therein. The metal silicide contact 24 could be, for example, a metal silicide contact formed on a source, drain or gate region in a VLSI device of the metal-oxide-semiconductor (MOS) type. Contact 24 could be composed of tantalum silicide ($TaSi_2$) or cobalt silicide ($CoSi_2$). The via 14 is the means by which a conductive connection will be made to contact 24. Structure 44 further includes a diffusion barrier layer 50 formed at the bottom of recess 14 to prevent the copper in copper alloy plug 46 from diffusing into substrate 26. The barrier layer 50 is required because an oxide layer will not form at the bottom of recess 14 because there is no oxygen atoms in silicide contact 24.

The embodiments of the method of the present invention which were described above with respect to FIGS. 3, 4 and 5 are equally applicable to FIG. 6 for forming copper alloy plug 46 and oxide layer 48. The oxide layer 48 of FIG. 6 performs the same desirable functions as oxide layer 32 in FIG. 3. The present invention is also directed to the interconnection structure 44 which results from using the method of the present invention.

Figure 1:
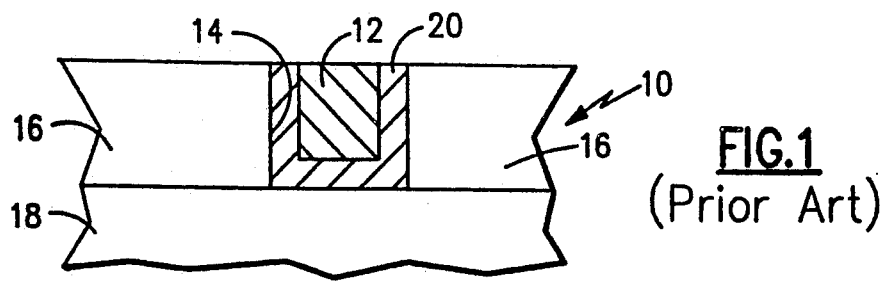
FIG. 1 is a schematic drawing showing the cross-section of a line or recess in a portion of a VLSI interconnection structure utilizing a prior art adhesion layer.
Figure 2:
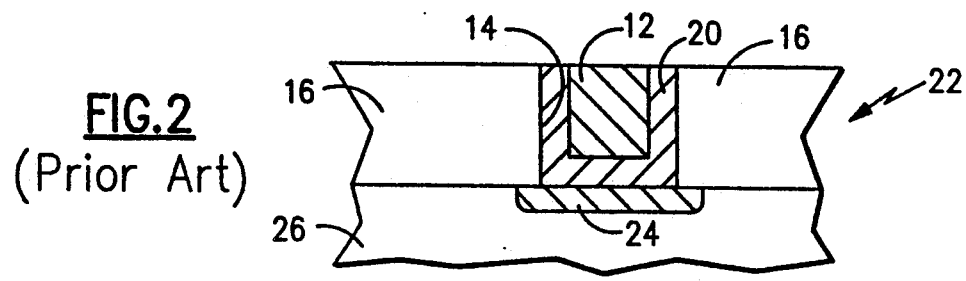
FIG. 2 is a schematic drawing showing the cross-section of a line or recess in a portion of another VLSI interconnection structure utilizing a prior art diffusion barrier and adhesion layer.

The use of the present invention in structure 44 of FIG. 6 is a significant improvement over BEOL copper metallization utilizing prior art diffusion barrier and adhesion layers. The prior art interconnection structure 22 required U-shaped diffusion and adhesion layer 20 as shown in FIG. 2. However, as shown in FIG. 6, the present invention only requires diffusion barrier 50 and oxide layer 48. Since oxide layer 48 forms partially inside dielectric layer 16 and is only 50–100 Å thick, it increases the available cross-section for copper alloy plug 46 thereby increasing the current-carrying capacity of micron or smaller lines.

While the invention has been particularly shown and described with respect to preferred embodiments thereof, it will be understood by those skilled in the art that the foregoing and other changes in form and details may be made therein without departing from the spirit and scope of the invention.

Having thus described the invention, what is claimed as new and what is desired to be secured by Letters Patent is:

1. A VLSI interconnection structure comprising:
   a substrate having at least one oxygen containing dielectric layer formed on one main planar surface of said substrate; and
   a conductive plug formed in a recess defined in said oxygen containing dielectric, said conductive plug comprising a copper alloy of copper and an alloying element of less than 2.0 atomic percent, and a thin layer of an oxide of said alloying element formed on an exposed surface of said copper alloy and on surfaces of said copper alloy in contact with said oxygen containing dielectric.

2. The structure of claim 1, wherein said oxygen containing dielectric layer comprises a dielectric selected from the group consisting of silicon dioxide and polyimide.

3. The structure of claim 1, wherein said alloying element comprises an element selected from the group consisting of chromium and aluminum.

4. The structure of claim 1, wherein said thin oxide layer comprises an oxide selected from the group consisting of chromium oxide and aluminum oxide.

5. The structure of claim 1, wherein said substrate comprises copper.

6. The structure of claim 1, wherein said substrate further comprises:
   a refractory metal barrier layer formed at the bottom of the recess and in contact with a bottom surface of said plug and a portion of an upper surface of said substrate; and
   a metal silicide layer formed in an upper portion of said substrate and in contact with a bottom surface of said barrier layer.

7. The structure of claim 1, wherein said substrate comprises silicon.

* * * * *